US011943872B2

(12) United States Patent
Inagaki et al.

(10) Patent No.: US 11,943,872 B2
(45) Date of Patent: Mar. 26, 2024

(54) MOUNTING DEVICE, MOUNTING SYSTEM, AND INSPECTION/MOUNTING METHOD

(71) Applicant: FUJI CORPORATION, Chiryu (JP)

(72) Inventors: Mitsutaka Inagaki, Anjo (JP); Shigeto Oyama, Kariya (JP); Haruna Narita, Higashiura-cho (JP)

(73) Assignee: FUJI CORPORATION, Chiryu (JP)

( * ) Notice: Subject to any disclaimer, the term of this patent is extended or adjusted under 35 U.S.C. 154(b) by 163 days.

(21) Appl. No.: 17/632,175

(22) PCT Filed: Aug. 2, 2019

(86) PCT No.: PCT/JP2019/030457
§ 371 (c)(1),
(2) Date: Feb. 1, 2022

(87) PCT Pub. No.: WO2021/024296
PCT Pub. Date: Feb. 11, 2021

(65) Prior Publication Data
US 2022/0287211 A1 Sep. 8, 2022

(51) Int. Cl.
*H05K 13/08* (2006.01)

(52) U.S. Cl.
CPC .................................... *H05K 13/08* (2013.01)

(58) Field of Classification Search
CPC ...................................................... H05K 13/08
See application file for complete search history.

(56) References Cited

U.S. PATENT DOCUMENTS 5,560,533 A * 10/1996 Maenishi ........... G01R 31/2806 228/8
2016/0299499 A1 10/2016 Ishimoto

FOREIGN PATENT DOCUMENTS

JP 2014-22681 A 2/2014
JP 2016-201430 A 12/2016

OTHER PUBLICATIONS

International Search Report dated Oct. 8, 2019 in PCT/JP2019/030457 filled on Aug. 2, 2019, 2 pages

* cited by examiner

*Primary Examiner* — Jason L Vaughan
(74) *Attorney, Agent, or Firm* — Oblon, McClelland, Maier & Neustadt, L.L.P.

(57) ABSTRACT

A mounting device of the present disclosure is used in a mounting system including multiple mounting devices that perform a mounting process on a mounting target. The mounting device includes a mounting section configured to pick up a component from a supply section holding the component and perform the mounting process for the component on the mounting target, an inspection section configured to perform an inspection process on the component disposed on the mounting target by using reference information, and a control section configured to, when the reference information is updated after an error in the component subjected to a mounting process prior to the mounting device is detected, cause the inspection section to execute the inspection process using the updated reference information on the component subjected to the mounting process prior to the mounting device.

8 Claims, 8 Drawing Sheets

Fig. 6
Fig. 6A
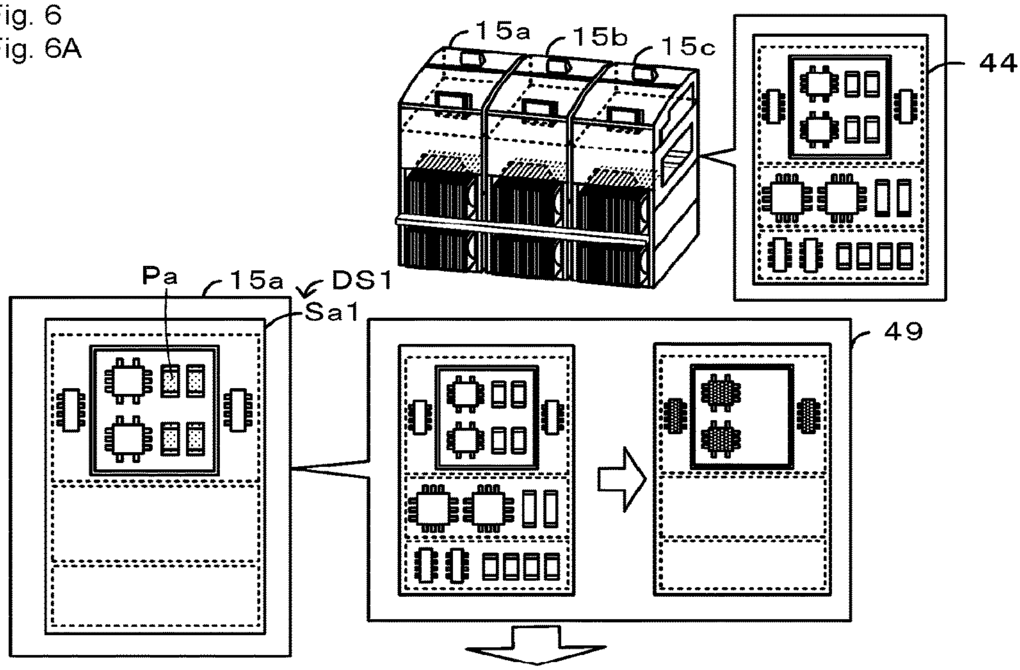
Fig. 6B
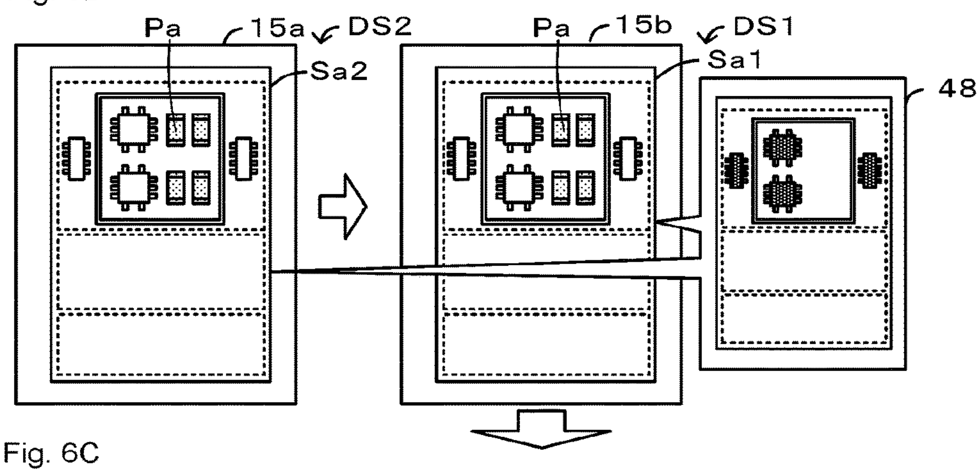
Fig. 6C
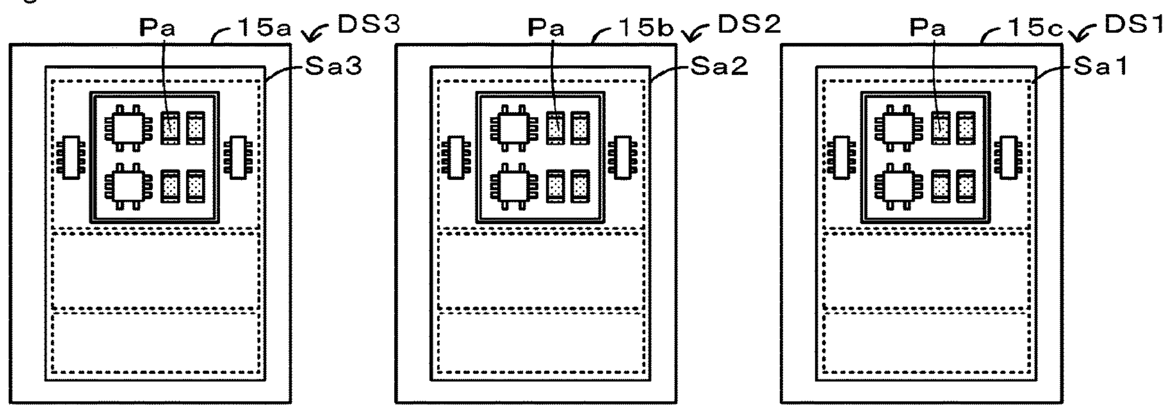

Fig. 7
Fig. 7A
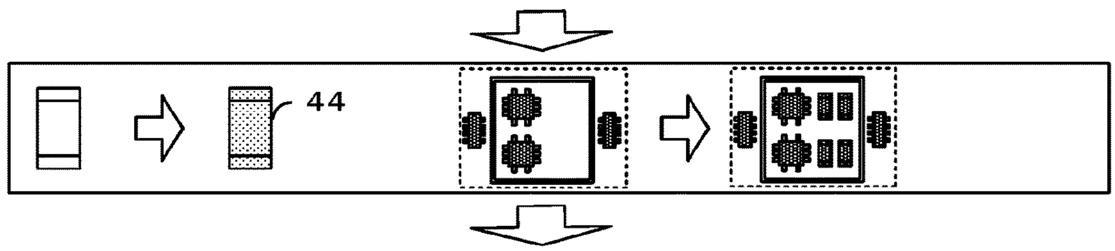
Fig. 7B
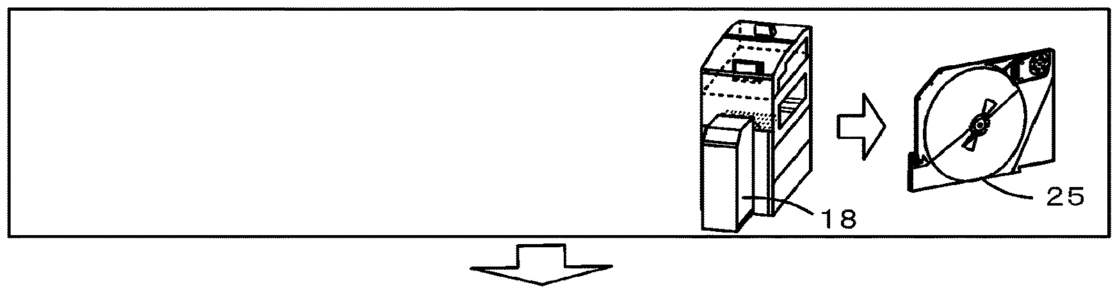
Fig. 7C
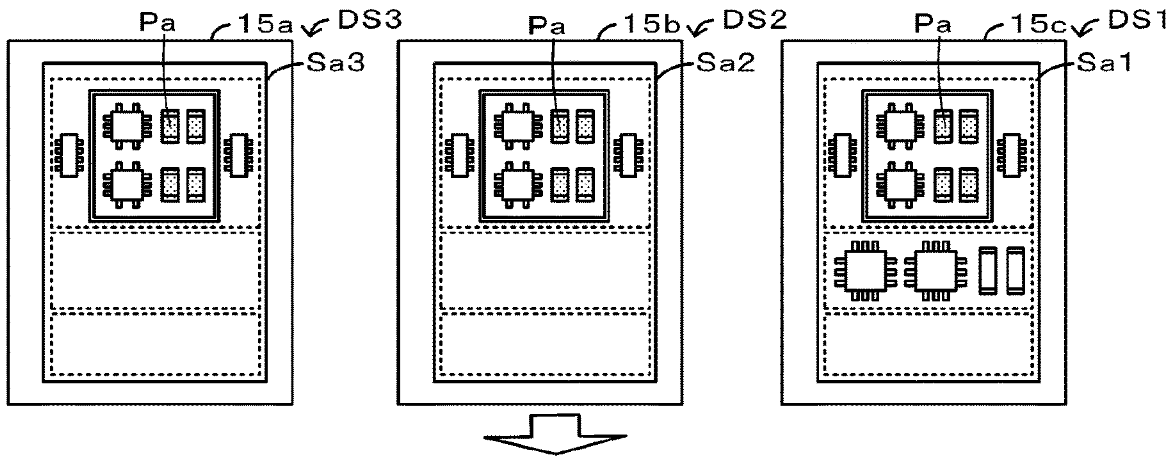
Fig. 7D
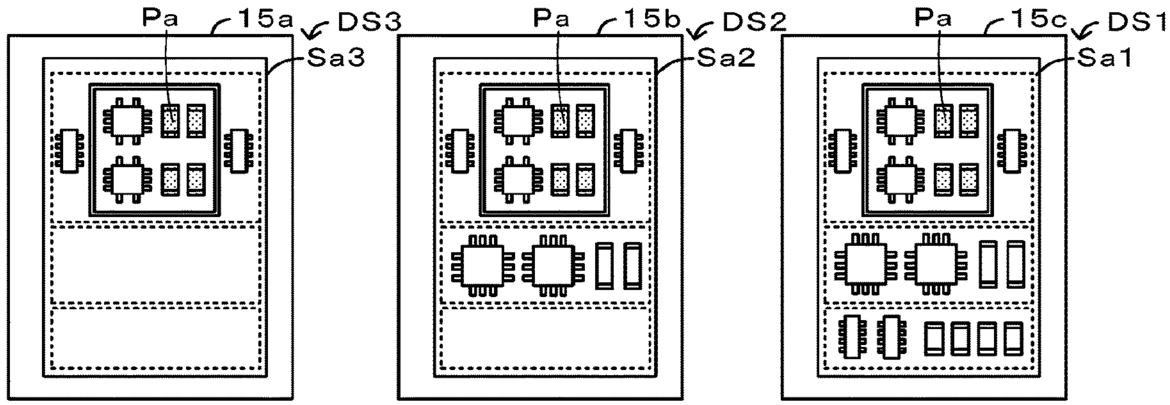

MOUNTING DEVICE, MOUNTING SYSTEM, AND INSPECTION/MOUNTING METHOD

TECHNICAL FIELD

The present specification discloses a mounting device, a mounting system, and an inspection/mounting method.

BACKGROUND ART

In the conventional art, as a mounting device, there has been proposed a device configured to, based on identification information read from a repair substrate requiring repair and read information for work, detect a mounting lane having a production spare capacity because components can be mounted on the repair substrate or a mounting lane having a high throughput, and to display the detected mounting lane (refer to Patent Literature 1, for example). In this mounting device, it is supposed that it is possible to reduce degradation in the production efficiency of the mounting lane when the repair substrate is introduced into the mounting lane.

PATENT LITERATURE

Patent Literature 1: JP-A-2014-22681

BRIEF SUMMARY

Technical Problem

However, the mounting device in Patent Literature 1 described above is based on the premise that a repair substrate removed from a production lane is inserted again into some of the mounting lanes, and it has not been considered to reduce the number of substrates that require repair in other methods.

The present disclosure has been made in view of such problems, and it is a principal object thereof to provide a mounting device, a mounting system, and an inspection/mounting method capable of more efficiently reducing loss of a mounting target subjected to a mounting process.

Solution to Problem

The present disclosure employs the following means in order to achieve the above principal object.

According to the present disclosure, there is provided a mounting device used in a mounting system including multiple mounting devices each performing a mounting process on a mounting target, the mounting device including a mounting section configured to pick up a component from a supply section holding the component and perform the mounting process for the component on the mounting target; an inspection section configured to perform an inspection process on the component disposed on the mounting target by using reference information; and a control section configured to, when the reference information is updated after an error in the component subjected to the mounting process prior to the mounting device is detected, cause the inspection section to execute the inspection process using the updated reference information on the component subjected to the mounting process prior to the mounting device.

In this mounting device, when the reference information is updated after an error in the component subjected to a mounting process prior to the mounting device is detected, the inspection section is caused to execute the inspection process using the updated reference information on the component subjected to the mounting process prior to the mounting device. The reference information of the mounting device may differ depending on a component, for example, due to a difference in a manufacturing company, a difference of a lot, or the like. When the mounting device uses reference information different from an actual component, an error may be determined even if a component is mounted within an allowable range. In this mounting device, even a component mounted by a mounting device prior to this mounting device is inspected by using the updated reference information, and thus even a result in which an error has been detected by mistake can be changed to an appropriate inspection result without being extracted from the device. Therefore, in this mounting device, it is possible to more efficiently reduce the loss of a mounting target subjected to a mounting process. Here, the “mounting target” includes a substrate, a panel including multiple substrates, a three-dimensional solid object, and the like. The reference information may include information regarding one or more of a shape, a brightness value, and a characteristic value of a component. The inspection process may include one or more of inspection of whether a component is disposed, inspection of a deviation amount of a component, inspection of a shape of a component, and inspection of a characteristic value of a component.

BRIEF DESCRIPTION OF DRAWINGS

FIG. 6 is an explanatory diagram illustrating a specific example of a process of skipping an inspection process and a mounting process.

FIG. 7 is an explanatory diagram illustrating a specific example of update of component information 46 and a remounting process.

DESCRIPTION OF EMBODIMENTS

Figure 1:
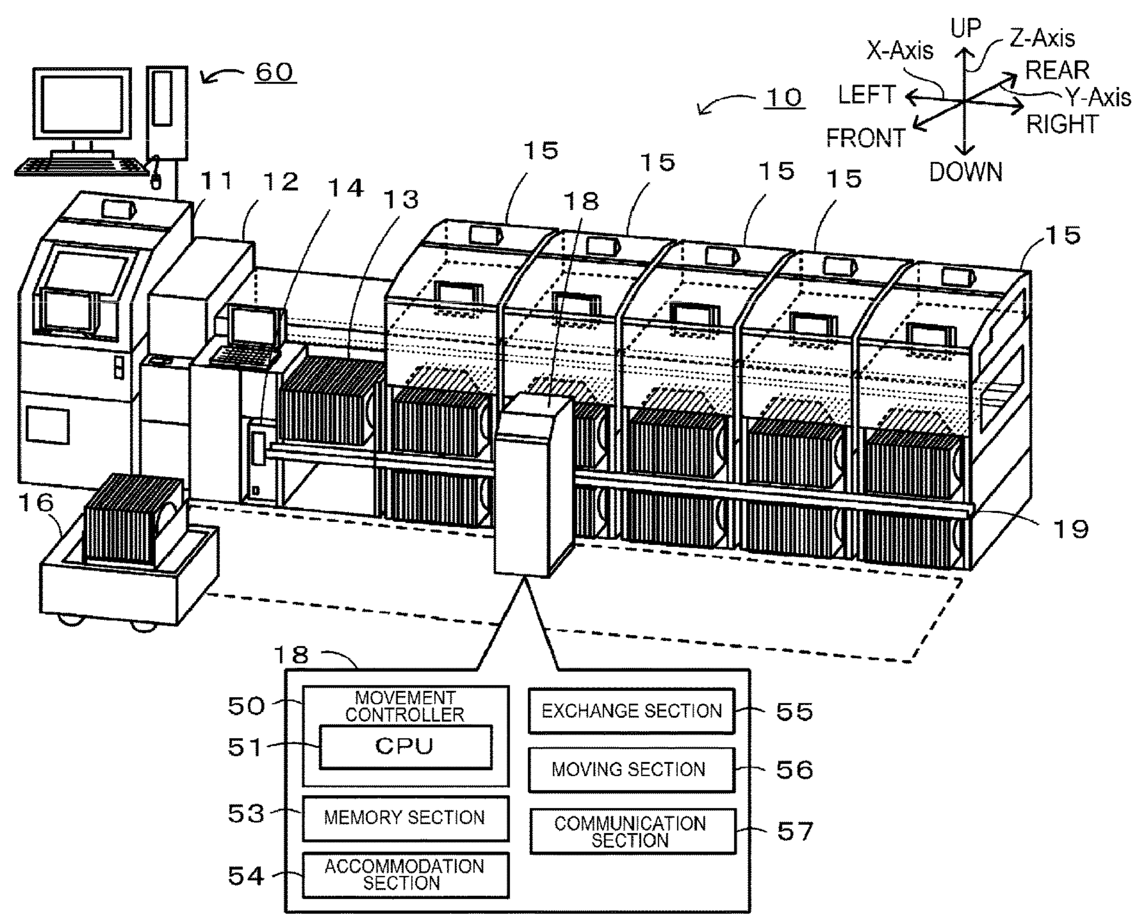
FIG. 1 is a schematic explanatory diagram illustrating an example of mounting system 10.
Figure 2:
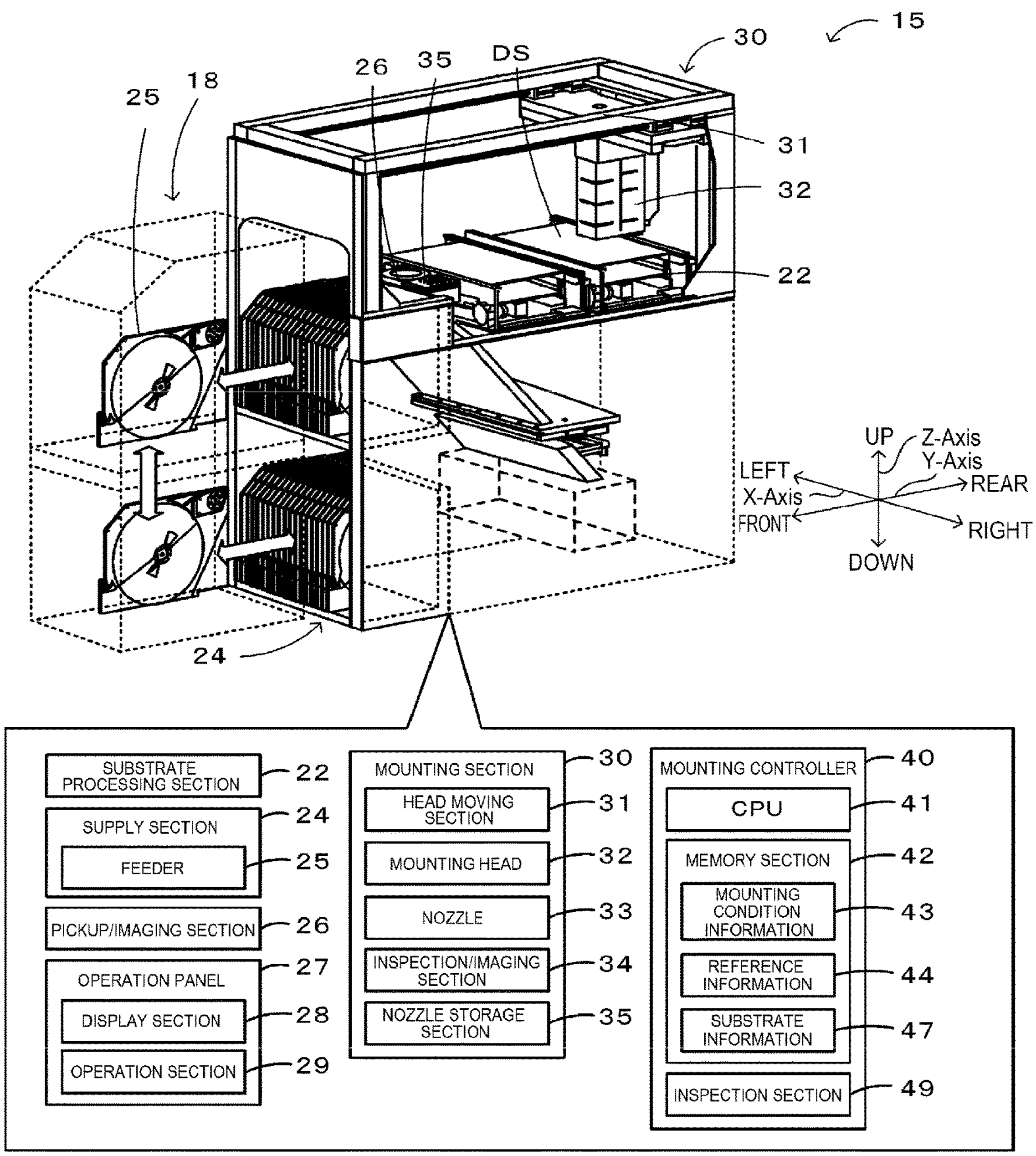
FIG. 2 is an explanatory diagram schematically illustrating a configuration of mounting device 15.
Figure 3:
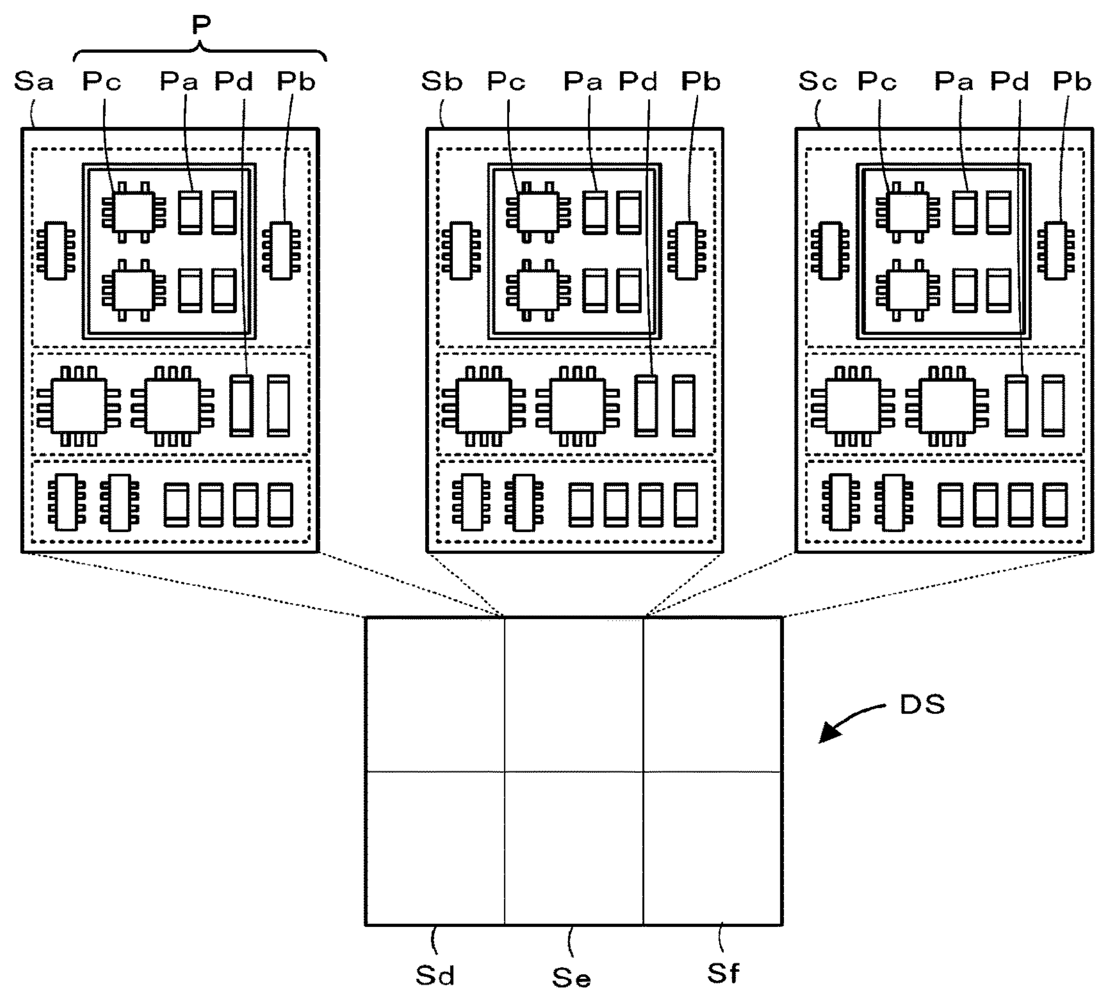
FIG. 3 is an explanatory diagram illustrating an example of board DS and substrate S.
Figure 4:
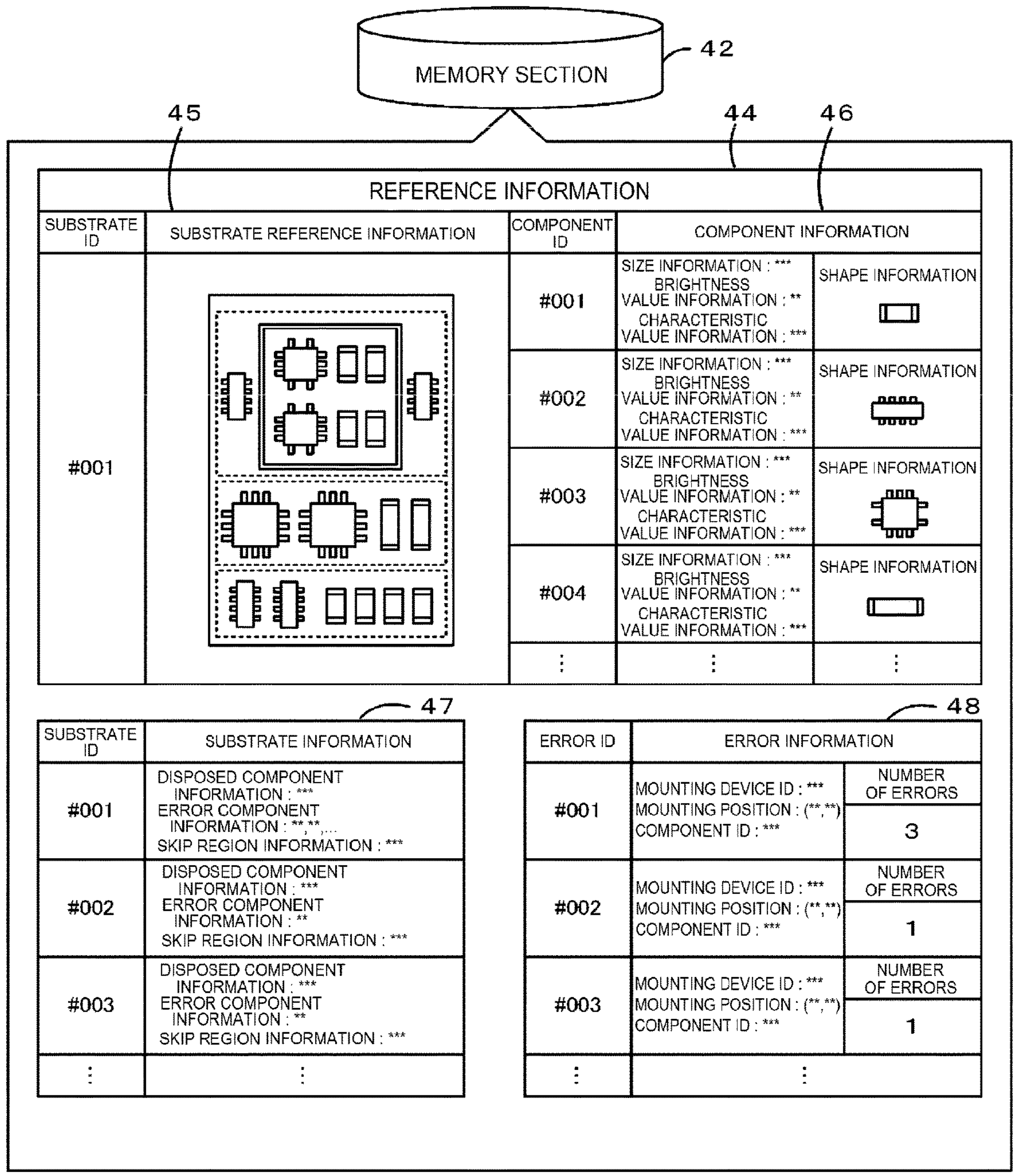
FIG. 4 is an explanatory diagram of information stored in memory section 42.

Hereinafter, the present embodiment will be described with reference to the drawings. FIG. 1 is a schematic explanatory diagram illustrating an example of mounting system 10 of the present disclosure. FIG. 2 is an explanatory diagram schematically illustrating an outline of a configuration of mounting device 15. FIG. 3 is an explanatory diagram illustrating an example of board DS and substrate S. FIG. 4 is an explanatory diagram of information stored in memory section 42. In the present embodiment, a left-right direction (X axis), a front-rear direction (Y axis), and an up-down direction (Z axis) are as illustrated in FIGS. 1 and 2.

Mounting system 10 is configured as, for example, a production line in which mounting devices 15 performing a mounting process for components P on substrate S serving as a mounting target are arranged in a conveyance direction of substrate S. Here, a mounting target is described as substrate S but is not particularly limited as long as component P is mounted thereon, and may be a base material having a three-dimensional shape. As illustrated in FIG. 1, mounting system 10 is configured to include printing device 11, printing inspection device 12, storage section 13, management PC 14, mounting device 15, automatic conveyance vehicle 16, loader 18, host PC 60, and the like. Printing device 11 is a device that prints a solder paste or the like on substrate S. Printing inspection device 12 is a device that inspects a state of a printed solder.

Board DS is a mounting target including multiple substrates S. As illustrated in FIG. 3, board DS includes multiple substrates Sa to Sf on which components Pa to Pd are disposed at the same positions. Here, components Pa to Pd are collectively referred to as component P, and substrates Sa to Sf are collectively referred to as substrate S. Board DS is configured to obtain multiple substrates S by dividing board DS along grooves formed on a top surface after a mounting process and a reflow process.

Mounting device 15 is a device that picks up component P and mounts component P on substrate S. Mounting device 15 has a function of executing a mounting/inspection process for inspecting component missing of substrate S or a state of a component disposed on substrate S. Mounting device 15 includes substrate processing section 22, component supply section 24, pickup/imaging section 26, mounting section 30, and mounting controller 40. As illustrated in FIG. 2, mounting controller 40 is configured as a microprocessor centered on CPU 41, and controls the entire device. Mounting controller 40 includes memory section 42 and inspection section 49. As illustrated in FIG. 4, memory section 42 stores mounting condition information 43, reference information 44, substrate reference information 45, component information 46, substrate information 47, and the like. Mounting condition information 43 is a production job, and includes information such as information of component P, a disposition order in which component P is mounted on substrate S, a disposition position, and an attachment position of feeder 25 from which component P is picked up. Reference information 44 includes, for example, data such as an image serving as a reference for detecting dispositional deviation or missing of component P. Reference information 44 includes substrate reference information 45, component information 46, and the like. Substrate reference information 45 is information regarding substrate S on which an inspection process is executed, and includes information regarding substrate S, such as an image, a size, and a shape of substrate S, in a manner associated with an identifier (ID) of substrate S. Component information 46 is information regarding component P on which an inspection process is executed, and includes information regarding component P, such as an image, a size, and a shape of component P, in association with an identifier (ID) of component P. Substrate information 47 is information for managing a mounting state or the like of substrate S, and includes, for example, information regarding a disposition position of disposed component P, information regarding the type or a position of a disposition error component that has missed or is disposed to be greatly deviated as a result of inspection, and information a skip region that is a region where a disposition error has occurred. Component missing means that component P is not present at a disposition position on substrate S due to some factor although a mounting process for component P is performed. In mounting device 15, when a disposition error of component P occurs, in order to prevent further loss of component P, it is possible to select a skip mode in which a predetermined region (for example, specific substrate S) is subjected to a skip process and a process for restricting a mounting process for further components P is executed. In mounting device 15, in order to suppress the frequent occurrence of skipping, when a disposition error is repeated a predetermined number of times (for example, three times) at the same disposition position, a process of stopping the device and notifying an operator is executed. This substrate information 47 is transmitted to host PC 60 and stored as a substrate information database for production management. Error information 48 is information for managing the number of times for which a disposition error has occurred at the same disposition position. Error information 48 includes an identifier (ID) of a mounting device in which a disposition error has occurred, a mounting position (coordinates), a type or an ID of a component, the number of errors, and the like. Error information 48 is transmitted to host PC 60 and stored as an error information database for production management. Mounting device 15 stores substrate information 47 and error information 48 in memory section 42 after the mounting process is started. Inspection section 49 is, for example, a functional block that inspects a state of substrate S or disposed component P based on a captured image of substrate S. Mounting controller 40 outputs control signals to substrate processing section 22, component supply section 24, and mounting section 30, and also receives signals from substrate processing section 22, component supply section 24, and mounting section 30.

Substrate processing section 22 is a unit that carries in, conveys, fixes at a mounting position, and carries out substrate S. Substrate processing section 22 has a pair of conveyor belts extending in the left-right direction and spaced apart from each other in the front-rear direction in FIG. 2. Substrate S is conveyed by these conveyor belts. Substrate processing section 22 includes two pairs of the conveyor belts, and can convey and fix two substrates S simultaneously. Component supply section 24 is a unit that supplies component P to mounting section 30. Component supply section 24 attaches feeder 25 including a reel around which a tape serving as a holding member holding component P is wound to at least one attachment portion. Component supply section 24 includes a mounting attachment portion attached with feeder 25 used for a mounting process and a buffer attachment portion attached with preliminary feeder 25 in upper and lower stages thereof. Feeder 25 includes a controller (not illustrated). The controller stores information such as an ID of a tape included in feeder 25, and the type and the remaining number of components P. When feeder 25 is attached to the attachment portion, the controller transmits information regarding feeder 25 to mounting controller 40. Component supply section 24 may include a tray unit having a tray as a holding member on which multiple components P are arranged and placed.

Pickup/imaging section 26 is a device that captures images of one or more components P in a state of being picked up and held by mounting head 32. Pickup/imaging section 26 is disposed between substrate processing section 22 and component supply section 24. An imaging range of pickup/imaging section 26 is located above pickup/imaging section 26. Pickup/imaging section 26 captures an image of component P when mounting head 32 holding component P passes over pickup/imaging section 26, and outputs the captured image to mounting controller 40. Based on the captured image and the reference image of reference information 44, mounting controller 40 may execute, for example, inspection of whether a shape and a part of component P are normal, or detection of a deviation amount of a position, rotation, or the like at the time of picking up component P.

Operation panel 27 includes display section 28 that displays a screen, and operation section 29 that receives an input operation from an operator. Display section 28 is configured as a liquid crystal display, and displays an operating state and a setting state of mounting device 15 on a screen. Operation section 29 includes a cursor key for moving a cursor in the up-down direction and the left-right direction, a cancel key for canceling an input, a determination key for determining a selected content, and the like, and thus an instruction from the operator can be keyed in.

Mounting section 30 is a unit that picks up component P from component supply section 24 and disposes component P on substrate S fixed to substrate processing section 22. Mounting section 30 includes head moving section 31, mounting head 32, nozzle 33, inspection/imaging section 34, and nozzle storage section 35. Head moving section 31 includes a slider moved by being guided by guide rails in the XY-directions, and a motor that drives the slider. Mounting head 32 picks up one or more components P and is moved in the XY-directions by head moving section 31. Mounting head 32 is detachably attached to the slider. One or more nozzles 33 are detachably attached to a lower surface of mounting head 32. Nozzle 33 picks up component P by using a negative pressure. A pickup member that picks up component P may be a mechanical chuck or the like that mechanically holds component P in addition to nozzle 33. Inspection/imaging section 34 is a camera that captures an image of a region below mounting head 32, and captures an image of, for example, not only component P disposed on substrate S but also a reference mark, a 2D code, or the like formed on substrate S. Inspection/imaging section 34 is disposed on the lower surface side of the slider to which mounting head 32 is attached, and is moved in the XY-directions in accordance with the movement of mounting head 32. Inspection/imaging section 34 outputs image data of substrate S on which component P is disposed to mounting controller 40. Mounting controller 40 causes inspection section 49 to analyze the image data. Nozzle storage section 35 accommodates one or more types of nozzles 33 to be attached to mounting head 32. Nozzle 33 for picking up component P subjected to a mounting process by another mounting device 15 may be accommodated in a preliminary accommodation section of nozzle storage section 35.

Storage section 13 is a storage location for temporarily storing feeder 25 used in mounting device 15. Storage section 13 is provided under a conveyance device between printing inspection device 12 and mounting device 15. Storage section 13 has an attachment portion in the same manner as component supply section 24. When feeder 25 is connected to the attachment portion, the controller of feeder 25 transmits the information regarding feeder 25 to management PC 14. In storage section 13, feeder 25 may be transported by automatic conveyance vehicle 16 or feeder 25 may be transported by an operator. Management PC 14 is a device that manages feeder 25, stores execution data or the like executed by loader 18, and manages loader 18. Automatic conveyance vehicle 16 automatically conveys feeder 25, a member used in mounting system 10, and the like between a warehouse (not illustrated) and storage section 13. The warehouse stores feeder 25, other members, and the like.

Loader 18 is a mobile work device, which is a device that is moved in a movement region in front of mounting system 10 (refer to dotted lines in FIG. 1), and automatically collects and provides members or the like necessary for a mounting process, such as feeder 25 of mounting device 15. Loader 18 includes movement controller 50, memory section 53, accommodation section 54, exchange section 55, moving section 56, and communication section 57. Movement controller 50 is configured as a microprocessor centered on CPU 51 and controls the entire device. Movement controller 50 controls the entire device such that feeder 25 is collected from component supply section 24 or feeder 25 is provided to component supply section 24, and feeder 25 is moved to and from storage section 13. Memory section 53 is, for example, an HDD that stores various data such as a processing program. Accommodation section 54 has an accommodation space for accommodating feeder 25. Accommodation section 54 is configured to accommodate, for example, four feeders 25. Exchange section 55 is a mechanism that moves feeder 25 in and out as well as moving feeder 25 in the up-down direction (refer to FIG. 2). Exchange section 55 has a clamp portion that clamps feeder 25, a Y-axis slider that moves the clamp portion in the Y-axis direction (front-rear direction), and a Z-axis slider that moves the clamp portion in the Z-axis direction (up-down direction). Exchange section 55 executes attachment and detachment of feeder 25 at a mounting attachment portion, and attachment and detachment of feeder 25 at a buffer attachment portion. Moving section 56 is a mechanism that moves loader 18 in the X-axis direction (the left-right direction) along X-axis rail 19 disposed in front of mounting device 15. Communication section 57 is an interface that performs exchange of information with external devices such as management PC 14 and mounting device 15. Loader 18 outputs the current position or details of executed work to management PC 14. Loader 18 is capable of collecting and providing feeder 25, but may be configured to collect and provide members related to the mounting process, such as mounting head 32, nozzle 33, a solder cartridge, a screen mask, and a backup pin for supporting a substrate.

Host PC 60 (refer to FIG. 1) is configured as a server that stores and manages information used by each device of mounting system 10, such as a production plan database including multiple pieces of mounting condition information 43, a substrate information database including multiple pieces of substrate information 47, and error information 48. Host PC 60 may input and edit image data, a size, a shape, a color, and the like in reference information 44. A control section of host PC 60 outputs updated reference information 44 to any device of mounting system 10, such as mounting device 15.

Figure 5:
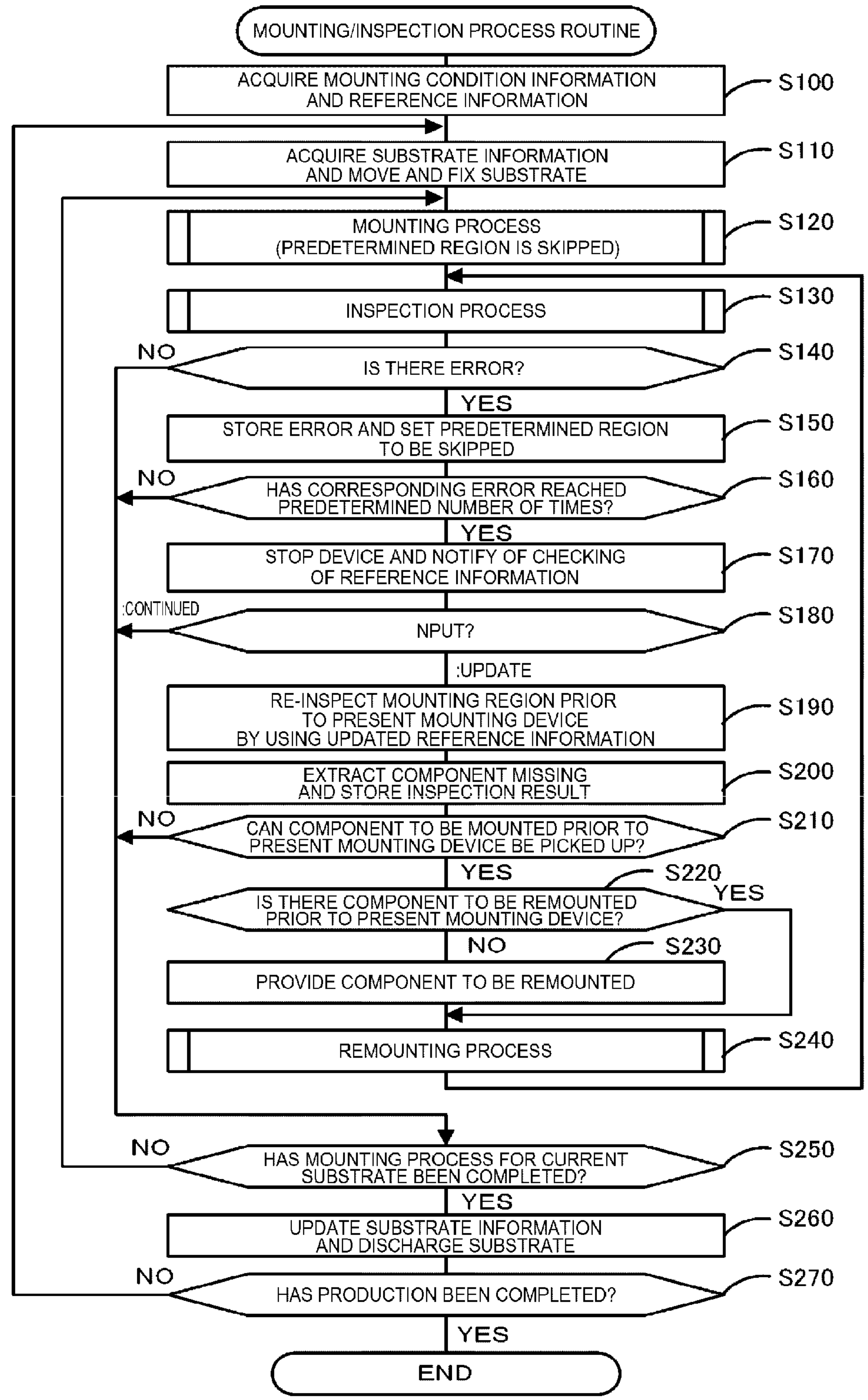
FIG. 5 is a flowchart illustrating an example of a mounting/inspection process routine.

Next, an operation of mounting system 10 of the present embodiment configured as described above, particularly, a process in which mounting device 15 mounts component P on substrate S and inspects mounted component P will be described. Here, for convenience of description, a mounting process for component P on board DS is assumed to be equivalent to a mounting process for component P on substrate S. Here, the description will focus on a case where a skip mode is selected. FIG. 5 is a flowchart illustrating an example of a mounting/inspection process routine executed by CPU 41 of mounting controller 40 of mounting device 15. This routine is stored in memory section 42 of mounting device 15 and executed in accordance with a starting instruction from an operator. When this routine is started, CPU 41 reads and acquires mounting condition information 43 and reference information 44 of substrate S to be produced this time (S100). CPU 41 is assumed to read mounting condition information 43 or reference information 44 acquired from host PC 60 and stored in memory section 42. Next, CPU 41 reads and acquires substrate information 47 of board DS (substrate S) subjected to a mounting process this time, and causes substrate processing section 22 to convey substrate S to a mounting position and to perform a fixing process (S110).

Next, CPU 41 executes a mounting process (S120). In this mounting process, CPU 41 sets a component that is a pickup target based on mounting condition information 43, causes mounting head 32 to pick up component P from feeder 25 at a preset position, moves mounting head 32 to a disposition position of component P, and executes a process of disposing component P. In the mounting process, CPU 41 restricts the mounting process, that is, does not execute the mounting process in order to suppress a loss of component P with respect to a predetermined region in which a disposition error has occurred. Next, CPU 41 executes an inspection process for disposed component P (S130). In the inspection process, CPU 41 causes inspection/imaging section 34 to capture an image of component P subjected to the mounting process by the present mounting device thereof, and acquires an inspection result of each component P based on whether component P is disposed at a predetermined disposition position or whether dispositional deviation such as positional deviation or rotational deviation is within a predetermined allowable range. The inspection result includes inspection pass in which there is no component missing, dispositional deviation is small, and a shape is within a designated shape, a dispositional deviation error, a component missing error, and a shape error. Regarding the component missing error, component P may be subjected to a mounting process by mounting device 15 subsequent to the present mounting device. In S120 and S130, CPU 41 may execute the inspection process collectively after the present mounting device performs the mounting process on all components P, or may repeatedly perform the mounting process and the inspection process.

After S130, CPU 41 determines whether there is an error, when there is an error, stores the error in substrate information 47 or error information 48, and sets a predetermined region that includes component P having an error and on which the mounting process will be skipped by subsequent mounting device 15 (S150). Next, CPU 41 determines whether the corresponding error has reached a predetermined number of times set in advance (S160), and when the predetermined number of times is reached, stops the device, and notifies the operator of checking of reference information 44 (S170). The term “predetermined number of times” means a threshold value for determining error detection, and includes not only the occurrence of the same error a predetermined number of times on the same substrate S, but also the repetition of the same error a predetermined number of times on different multiple substrates S. For example, the reference data of reference information 44 may be different from component P that is actually used, such as a difference in a brightness value (color) differing or a difference in a shape (a lead is long or short), depending on the operator’s discrepancy, or a lot or a vendor of component P. In such a case, even if component P is appropriately disposed on substrate S, CPU 41 may erroneously determine that an error has occurred. Here, CPU 41 notifies the operator whether there are any such errors. This notification may be performed, for example, by performing a process of displaying a message, an icon, or the like on operation panel 27, by lighting a lamp, or by outputting sound, voice, or the like. The operator notified of the checking of reference information 44 checks, for example, whether the content of reference information 44 in host PC 60 and component P used in mounting device 15 are different from each other. In a case where there is no problem in reference information 44, the operator operates operation panel 27 to input information indicating that the process is continued, whereas in a case where reference information 44 is changed, the operator inputs information indicating that reference information 44 is newly updated.

Next, CPU 41 acquires the input content from the operator from operation panel 27, and when acquiring the input in which reference information 44 has been updated, CPU 41 re-inspects a mounting region that has been subjected to the mounting process prior to the present mounting device by using updated reference information 44 (S190). As described above, since a result of the inspection process in mounting device 15 different from the present mounting device may not be correct, CPU 41 performs a re-inspection process using correct reference information 44 on the region that is not subjected to the mounting process by the present mounting device, and thus obtains a more appropriate inspection result. When the re-inspection process is performed, CPU 41 extracts a component missing error from the inspection result, and stores the inspection result including the component missing error in reference information 44 (S200). In mounting device 15, component missing is naturally detected in a predetermined region on which the mounting process is skipped in the skip mode.

Subsequently, when there is a component missing error, CPU 41 executes a remounting process (S210 to S240). Specifically, CPU 41 determines whether component P to be mounted by mounting device 15 prior to the present mounting device can be picked up by mounting section 30 of the present mounting device (S220). This determination may be performed based on, for example, whether there is corresponding nozzle 33 in nozzle storage section 35, based on correspondence information in which corresponding component P is correlated with mounting head 32 and nozzle 33 that can pick up component P. When corresponding component P can be picked up by the present mounting device, CPU 41 determines whether component P to be remounted by the present mounting device is present in component supply section 24 (S220). Feeder 25 used in another mounting device 15 and not used in the present mounting device may be preliminarily attached to a preliminary attachment portion of component supply section 24. When component P to be remounted is not present in component supply section 24, CPU 41 outputs a command for providing feeder 25 holding component P to be remounted to component supply section 24, to management PC 14 (S230). Management PC 14 outputs a storage position in the storage section 13 storing corresponding feeder 25 and a position of component supply section 24 of mounting device 15 that requires the provision to loader 18, and causes loader 18 to provide feeder 25. After S230 or when component P to be remounted is present in component supply section 24 in S220, CPU 41 causes mounting section 30 to execute the remounting process (240). Mounting section 30 disposes component P to be remounted that is not scheduled to be subjected to a mounting process by this mounting device 15 on substrate S.

After executing the remounting process in S240, CPU 41 executes the processes in and after S130. That is, CPU 41 executes an inspection process on remounted component P, and repeatedly performs processes of determining whether there is an error, setting a predetermined region when there is an error, and determining whether the corresponding error has been repeated a predetermined number of times (S140 to S160). Since reference information 44 is updated in S180, the frequency of error detection in mounting device 15 is reduced.

In a case where there is no error in the inspection result in S140, when the corresponding error has not reached a predetermined number of times in S160, or after a continuous input is acquired without updating reference information 44 in S180, or when it is not possible to pick up component P to be remounted by the present mounting device in S210, CPU 41 determines whether the mounting process for current substrate S has been completed (S250). When the mounting process for the current substrate has not been completed, CPU 41 executes the processes in and after S120. That is, CPU 41 continuously executes the mounting process and the inspection process (S120 and S130). On the other hand, when the mounting process for current substrate S has been completed, CPU 41 updates substrate information 47 and controls substrate processing section 22 to discharge substrate S (S260). CPU 41 determines whether production of all substrates S set in mounting condition information 43 has been completed (S270). When the production of all substrates S has not been completed, CPU 41 executes the processes in and after S110. On the other hand, when the production of all substrates S has been completed, this routine is finished. Since such a mounting process is executed by each of mounting devices 15, information regarding which position an error is likely to occur on specific substrate S is integrated and stored in substrate information 47.

Here, a specific example of the mounting/inspection process will be described. FIG. 6 is an explanatory diagram for describing a specific example of a process of skipping the inspection process and the mounting process, in which FIG. 6A is a diagram illustrating a case where substrate S1 is inspected by mounting device 15*a* based on inappropriate reference information 44, FIG. 6B is a diagram illustrating a case where substrate S1 is skipped by the next mounting device 15*b*, and FIG. 6C is a diagram illustrating a case where substrate S1 is skipped by mounting device 15*c*, substrate S2 is skipped by mounting device 15*b*, and a device is stopped. FIG. 7 is an explanatory diagram for describing a specific example of update of component information 46 and the remounting process, in which FIG. 7A is a diagram illustrating a case where reference information 44 is updated and the re-inspection process is performed based on updated reference information 44, FIG. 7B is a diagram illustrating a case where loader 18 is supplemented with feeder 25 to be remounted, FIG. 7C is a diagram illustrating a case where the remounting process is performed, and FIG. 7D is a diagram illustrating a case where remaining components P to be mounted by the present mounting device are mounted. Here, a case where reference information 44 in which a brightness value of a reference image of component Pa is different from that of an actual component is used in board DS in FIG. 3 will be described as a specific example. In mounting condition information 43, it is assumed that mounting device 15*a* is set to perform a mounting process and an inspection process on an upper stage of substrate S, the next mounting device 15*b* is set to perform a mounting process and an inspection process on an intermediate stage of substrate S, and the next mounting device 15*c* is set to perform a mounting process and an inspection process on a lower stage of substrate S. It is assumed that a predetermined number of times, which is an allowable number of repetitions of errors, is three, and a skip region is set on one substrate S of board DS. In FIGS. 6 and 7, board DS1 including substrate Sa1, board DS2 including substrate Sa2, and board DS3 including substrate Sa3 are sequentially supplied to mounting devices 15*a*, 15*b*, and 15*c* from the upper part to the lower part in the drawing over time, and only substrates Sa1 to Sa3 of boards DS1 to DS3 are illustrated for convenience. In the following descriptions of FIGS. 6 and 7, processes for substrates Sb to Sf of board DS are assumed to be the same process as that for substrate Sa of board DS, and detailed descriptions thereof will be omitted.

First, as illustrated in FIG. 6A, mounting device 15*a* executes a mounting process and an inspection process on substrate Sa1 of board DS1 (S120 and S130). Since an image of component Pa of reference information 44 differs from actual component Pa, inspection section 49 of mounting device 15*a* erroneously detects that component Pa is missing even though component Pa is appropriately mounted on substrate Sa1, and sets entire substrate Sa1 in a predetermined region where the mounting process is skipped (S150). Next, as illustrated in FIG. 6B, board DS1 is conveyed to mounting device 15*b* (S260), and board DS2 is carried into mounting device 15*a* (S110). Also in substrate Sa2 of board DS2, similarly to substrate Sa1, it is determined that component Pa that is appropriately mounted is missing, and entire substrate Sa2 is set in a predetermined region where the mounting process is skipped. Since entire substrate Sa1 is the skip region, mounting device 15*b* does not execute the mounting process on component P. Next, as illustrated in FIG. 6C, board DS1 is conveyed to mounting device 15*c*, board DS2 is conveyed to mounting device 15*b*, and board DS3 is carried into mounting device 15*a*. Also in substrate Sa3, similarly to substrates Sa1 and Sa2, it is determined that component Pa that is appropriately mounted is missing, and entire substrate Sa3 is set in a predetermined region where the mounting process is skipped. Since entire substrates Sa1 and Sa2 are the skip regions, mounting devices 15*b* and 15*c* do not execute the mounting process on component P. The corresponding error reaches a predetermined number of times, that is, three times (S160), mounting devices 15*a* to 15*c* are stopped and notify an operator of checking of reference information 44 (S170).

Figure 8:
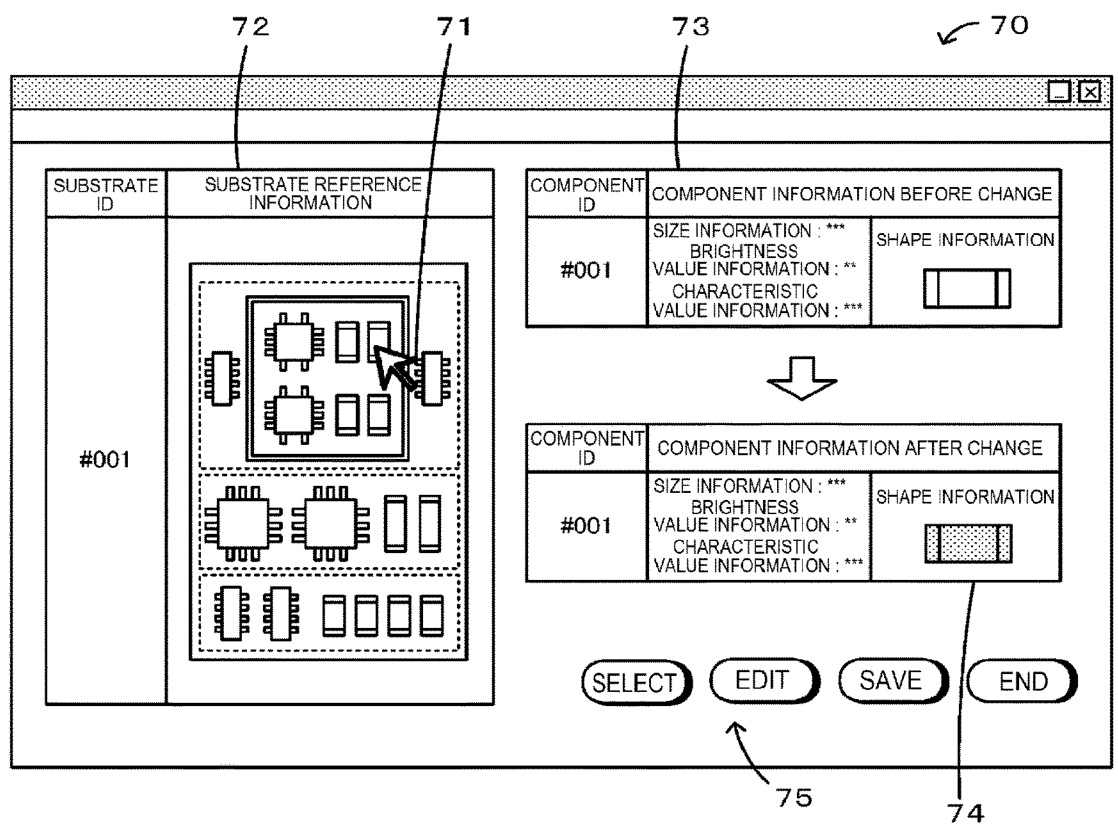
FIG. 8 is an explanatory diagram illustrating an example of reference information update screen 70.

Here, as illustrated in FIG. 7A, the operator checks component Pa and the reference image of reference information 44, and updates reference data to correct reference data in host PC 60. FIG. 8 is an explanatory diagram illustrating an example of reference information update screen 70 displayed on a display of host PC 60. Reference information update screen 70 is a screen displayed when information regarding component P, such as image data, a size, a brightness value, and a characteristic value included in component information 46 is input and updated. On reference information update screen 70, cursor 71, substrate reference information display field 72, pre-change component information display field 73, post-change component information display field 74, input key 75, and the like are displayed. Cursor 71 is used for an operator to give an instruction for selection and entry to an entry field disposed on the screen, and is moved on the screen by operating an input device of host PC 60. An image of component P disposed on substrate S is displayed in substrate reference information display field 72. Pre-change component information display field 73 is a field in which reference data, information, and the like currently used for component P selected in substrate reference information display field 72 are displayed. Post-change component information display field 74 is a field to which updated data of component P displayed in pre-change component information display field 73 is entered. Input key 75 includes a selection key, an edit key, a save key, an end key, and the like. The operator checks the displayed contents, presses the edit key to edit the contents, and presses the save key to store reference information 44 of which the reference data is updated in the memory section of host PC 60. Host PC 60 transmits updated reference information 44 to mounting devices 15*a* to 15*c*. Mounting devices 15*a* to 15*c* execute a re-inspection process by using updated reference information 44 (S190). In this case, mounting devices 15*a* to 15*c* obtain an inspection result indicating that there is no missing in component P subjected to a mounting process by mounting device 15*a*, and store the inspection result in substrate information 47 (S200). Substrate information 47 stores information indicating that component Pa is not missing with respect to substrate IDs corresponding to substrates Sa1, Sa2, and Sa3.

Next, mounting devices 15*a* to 15*c* extract a missing component caused by skipping or the like (S200), and execute a remounting process for the missing component (S210 to S240). In this case, in mounting devices 15*a* to 15*c*, when remounted component P to be mounted prior to the present mounting device can be picked up by the present mounting device and component P is not present, feeder 25 is provided to loader 18 as illustrated in FIG. 7B (S230). Subsequently, as illustrated in FIG. 7C, mounting device 15*c* executes a mounting process for component P to be mounted by mounting device 15*b* (S240). As illustrated in FIG. 7C, in mounting devices 15*b* and 15*c*, a mounting process for component P that is originally to be subjected to a mounting process by each device is executed after remounting (S120). As illustrated in FIG. 7C, by executing the above re-inspection process and remounting process, it is possible to remove component missing without loss of substrate S or component P, and return to processing states in which mounting devices 15*a* to 15*c* are originally to be.

Here, correspondence relationships between constituents of the present embodiment and constituents of the present disclosure will be clarified. Mounting section 30 of the present embodiment corresponds to a mounting section of the present disclosure, inspection section 49 corresponds to an inspection section, mounting controller 40 corresponds to a control section, loader 18 corresponds to a mobile work device, and component supply section 24 corresponds to a supply section. In the present embodiment, an example of the inspection/mounting method of the present disclosure is also clarified by describing the operation of mounting device 15.

In mounting device 15 of the present embodiment described above, when reference information 44 is updated after an error in component P that has been subjected to the mounting process prior to mounting device 15 is detected, inspection section 49 is caused to execute an inspection process using updated reference information 44 also on component P that has been subjected to the mounting process prior to mounting device 15. Reference information 44 of mounting device 15 may differ according to component P, for example, due to a difference in a manufacturing company or a difference in a lot. When reference information 44 different from actual component P is used, mounting device 15 may determine an error even if component P is mounted within an allowable range. In mounting device 15, even component P mounted on mounting device 15 prior to this mounting device 15 is inspected by using updated reference information 44, and thus even a result in which an error has been detected by mistake can be changed to an appropriate inspection result without being extracted from the device. Therefore, in mounting device 15, it is possible to more efficiently reduce the loss of substrate S (board DS) that is a mounting target subjected to a mounting process.

Mounting controller 40 causes inspection section 49 to execute an inspection process using reference information 44 on component P subjected to a mounting process by mounting section 30, and when reference information 44 is updated after an error in component P subjected to the mounting process prior to present mounting device 15 is detected, causes inspection section 49 to execute an inspection process using updated reference information 44 on component P subjected to the mounting process by mounting section 30 of present mounting device 15. In mounting device 15, since component P mounted by mounting device 15 is inspected by using updated reference information 44, even a result in which an error has been detected by mistake can be changed to an appropriate inspection result without being extracted from the device. Mounting controller 40 has a skip mode in which, when there is an error in a predetermined region including component P subjected to a mounting process prior to mounting device 15, and an operation of mounting section 30 is restricted such that a mounting process is skipped without being performed on the predetermined region in which there is the error, and when reference information 44 is updated, causes inspection section 49 to execute the inspection process using updated reference information 44 on the skipped predetermined region. In mounting device 15, even a result in which an error has been detected by mistake in the skipped predetermined region having an error can be changed to an appropriate inspection result without being extracted from the device. in this mounting device, it is possible to further reduce the loss of component P by restricting component P from being disposed in a predetermined region having an error due to the skip mode.

After reference information 44 is updated, when component P to be subjected to a mounting process on the skipped predetermined region is present in component supply section 24, mounting controller 40 causes mounting section 30 to execute the mounting process on the skipped predetermined region. In mounting device 15, by disposing component P in the skipped predetermined region, it is possible to further reduce the loss of substrate S subjected to a mounting process. In mounting device 15, component supply section 24 is attached with feeder 25 having a tape as a holding member that holds component P, and mounting system 10 further includes loader 18 as a mobile work device including accommodation section 54 that accommodates feeder 25, collecting feeder 25 from component supply section 24, and/or moving feeder 25 to component supply section 24. When component P to be subject to a mounting process on the skipped predetermined region can be picked up by mounting section 30 and is not in component supply section 24, mounting controller 40 outputs, to loader 18, information for moving feeder 25 holding component P to be mounted to component supply section 24. In mounting device 15, the loss of substrate S can be reduced by automatically providing component P with loader 18.

When an error is detected in a predetermined number of substrates S at a specific disposition position, mounting controller 40 stops mounting section 30 and inspection section 49, notifies an operator to check reference information 44, and restarts the processes of mounting section 30 and inspection section 49 when reference information 44 is updated. In mounting device 15, it is possible to appropriately prompt the review of reference information 44, and consequently, it is possible to more efficiently reduce the loss of substrate S. Since reference information 44 includes information regarding one or more of a shape of component P, a brightness value of component P, and a characteristic value of component P, the loss of substrate S can be reduced more efficiently by using specific reference information. A mounting target is board DS including multiple substrates S, and a predetermined region where a mounting process is skipped is a region of substrate S. By restricting the mounting of component P on a specific region, it is possible to more efficiently reduce the loss of component P.

Needless to say, the present disclosure is not limited to the embodiment that has been described, and can be carried out in various forms without departing from the technical scope of the present disclosure.

For example, in the above embodiment, the predetermined region where there is an error has been described as the region of substrate S included in board DS, but the present disclosure is not particularly limited thereto, and may be a region of single substrate S not included in board DS, or may be a region inside substrate S. In the above embodiment, mounting device 15 performs the skip process on the predetermined region where there is an error, but the skip process may be omitted. Also in mounting device 15, appropriate inspection can be executed by using updated reference information 44.

In the above embodiment, the remounting process is executed on the skipped predetermined region, but the present disclosure is not particularly limited thereto, and CPU 41 may execute the remounting process as long as remounting is possible regardless of the skipped predetermined region. In the above embodiment, when there is no component P to be remounted, loader 18 provides component P, but the present disclosure is not particularly limited thereto, and loader 18 may be omitted, and component P may be provided by automatic conveyance vehicle 16 or may be provided by an operator. Alternatively, loader 18 may be omitted, and feeder 25 used in another mounting device 15 may be attached to a free attachment portion of component supply section 24 so as not to require provision.

In the above embodiment, the device is stopped when an error is detected for a predetermined number of times in substrate S at a specific disposition position, but an operator may be notified without stopping the device. In consideration of the loss of substrate S, it is preferable that CPU 41 stops the device.

Although not described in detail in the above embodiment, in a case where missing component P cannot be picked up by mounting section 30 of current mounting device 15 after reference information 44 is updated, component P may be remounted by mounting device 15 as long as component P to be remounted by mounting device 15 further downstream thereof can be picked up. In mounting system 10, since production of substrate S can be more reliably completed, it is possible to more efficiently reduce the loss of substrate S.

In the above embodiment, in the inspection process, although an inspection process for dispositional deviation of component P or component missing has been mainly described, CPU 41 may execute the inspection process of inspecting characteristics of component P, for example, a resistance value of component P, a shading rate of component P, or the like. CPU 41 may cause mounting section 30 to pick up and discard component P having an error in the characteristic value, and may remount new component P.

A mounting target has been described as board DS including multiple substrates S in the above embodiment, but is not particularly limited to this, and may be substrate S other than board DS, a three-dimensional solid object, or the like. Reference information 44 may include information regarding one or more of the shape, the brightness value, and the characteristic value of the component. The inspection process may include one or more of inspection as to whether a component is disposed, inspection as to a deviation amount of a component, and inspection as to the characteristic value of a component.

In the above embodiment, the present disclosure has been described as mounting system 10 or mounting device 15, but may be an inspection/mounting method executed by mounting device 15 or a program for realizing the inspection/mounting method of mounting device 15.

Here, the mounting device, the mounting system, and the inspection/mounting method of the present disclosure may be configured as follows. For example, in the mounting device of the present disclosure, the control section may cause the inspection section to execute an inspection process using the reference information on a component subjected to a mounting process by the mounting section, and when the reference information is updated after an error in the component subjected to a mounting process prior to the mounting device is detected, cause the inspection section to execute the inspection process using the updated reference information on the component subjected to the mounting process by the mounting section of the mounting device. In this mounting device, since a component mounted by the mounting device is inspected by using the updated reference information, even a result in which an error has been detected by mistake can be changed to an appropriate inspection result without being extracted from the device.

In the mounting device of the present disclosure, the control section may have a skip mode in which, when there is an error in a predetermined region including the component subjected to a mounting process prior to the mounting device, and an operation of the mounting section is restricted such that a mounting process is skipped without being performed on the predetermined region in which there is the error, and cause the inspection section to execute the inspection process using the updated reference information on the skipped predetermined region when the reference information is updated. In this mounting device, even a result in which an error has been detected by mistake in the skipped predetermined region having an error can be changed to an appropriate inspection result without being extracted from the device. in this mounting device, it is possible to further reduce the loss of components by restricting a component from being disposed in a predetermined region having an error due to the skip mode.

In the mounting device of the present disclosure in an aspect of skipping a mounting target, the control section may cause the mounting section to execute the mounting process on the skipped predetermined region when the component to be subjected to a mounting process on the skipped predetermined region is present in the supply section after the reference information is updated. In this mounting device, it is possible to further reduce the loss of the mounting target subjected to a mounting process by disposing a component in the skipped predetermined region. Alternatively, in the mounting device of the present disclosure in the aspect of skipping a mounting target, the supply section may be attached with a holding member that holds the component, and the mounting system may further include a mobile work device including an accommodation section that accommodates the holding member to collect the holding member from the supply section and/or move the holding member to the supply section, in which the control section may output, to the mobile work device, information for moving the holding member holding the component to be mounted to the supply section when the component to be subjected to the mounting process on the skipped predetermined region can be picked up by the mounting section and is not present in the supply section. In this mounting device, it is possible to reduce the loss of a mounting target by automatically providing components with the mobile work device.

In the mounting device of the present disclosure, when the error is detected in a predetermined number of the mounting targets at a specific disposition position, the control section may stop the mounting section and/or the inspection section, notify an operator to check the reference information, and restart processes of the mounting section and/or the inspection section when the reference information is updated. In this mounting device, it is possible to appropriately prompt the review of the reference information, and consequently, it is possible to more efficiently reduce the loss of a mounting target.

The mounting device of the present disclosure may have any of the following features (1) or (2). Also in this mounting device, it is possible to more efficiently reduce the loss of a mounting target in specific reference information or mounting target. (1) The reference information includes information regarding one or more of a shape of the component, a brightness value of the component, and a characteristic value of the component. (2) The mounting target is a board including multiple substrates, and the predetermined region is a region of the substrate.

The mounting device of the present disclosure includes multiple mounting devices described above. The mounting system can achieve an effect according to an aspect employed by the above mounting device.

The inspection/mounting method according to the present disclosure is an inspection/mounting method used in a mounting system including multiple mounting devices each performing a mounting process on a mounting target and including a mounting section that picks up a component from a supply section holding the component and performs the mounting process for the component on the mounting target, and an inspection section that performs an inspection process on the component disposed on the mounting target by using reference information, the inspection/mounting method including a step of, when the reference information is updated after an error in the component subjected to a mounting process prior to the mounting device is detected, causing the inspection section to execute the inspection process using the updated reference information on the component subjected to the mounting process prior to the mounting device.

In this inspection/mounting method, similarly to the mounting device described above, even a component before being mounted by this mounting device is inspected using the updated reference information, and thus even a result in which an error has been detected by mistake can be changed to an appropriate inspection result without being extracted from the device. Therefore, also in this inspection/mounting method, it is possible to more efficiently reduce the loss of a mounting target subjected to a mounting process. This inspection/mounting method may employ the aspect of the mounting device described above, or may include a step of expressing the function of the mounting device described above.

INDUSTRIAL APPLICABILITY

The mounting device, the mounting system, and the inspection/mounting method of the present disclosure can be used in electronic component mounting fields.

REFERENCE SIGNS LIST

10 Mounting system, 11 Printing device, 12 Printing inspection device, 13 Storage section, 14 Management PC, 15, 15*a*, 15*b*, 15*c* Mounting device, 16 Automatic conveyance vehicle, 18 Loader, 19 X-axis rail, 22 Substrate processing section, 24 Component supply section, 25 Feeder, 26 Pickup/imaging section, 27 Operation panel, 28 Display section, 29 Operation section, 30 Mounting section, 31 Head moving section, 32 Mounting head, 33 Nozzle, 34 Inspection/imaging section, 35 Nozzle storage section, 40 Mounting controller, 41 CPU, 42 Memory section, 43 Mounting condition information, 44 Reference information, 45 Substrate reference information, 46 Component information, 47 Substrate information, 48 Error information, 49 Inspection section, 50 Movement controller, 51 CPU, 53 Memory section, 54, Accommodation section, 55 Exchange section, 56 Moving section, 57 Communication section, 60 Host PC, 70 Reference information update screen, 71 Cursor, 72 Substrate reference information display field, 73 Pre-change component information display field, 74 Post-change component information display field, 75 input key, DS, DS1 to DS3 Board, P, Pa to Pd component, S, Sa to Sf, and Sa1 to Sa3 substrate

The invention claimed is:

1. A mounting device used in a mounting system including multiple mounting devices each performing a mounting process on a mounting target, the mounting device comprising:

a mounting section configured to pick up a component from a supply section holding the component and perform the mounting process for the component on the mounting target;

an inspection section configured to perform an inspection process on the component disposed on the mounting target by using reference information; and a control section configured to, when the reference information is updated to updated reference information after an error in the component subjected to a prior mounting process prior to the mounting device is detected, cause the inspection section to execute the inspection process using the updated reference information on the component subjected to the prior mounting process, when the error is detected in a predetermined number of the mounting targets at a specific disposition position, the control section stops at least one of the mounting section and the inspection section and notifies an operator to check the reference information, and when the reference information is updated, the control section restarts processes of the at least one of the mounting section the inspection section.

2. The mounting device according to claim 1, wherein when the error is detected in a predetermined number of the mounting targets at a specific disposition position, the control section stops the mounting section and/or the inspection section and notifies an operator to check the reference information, and when the reference information is updated, the control section restarts processes of the mounting section and/or the inspection section.

3. The mounting device according to claim 1, wherein the mounting device has any of the following features (1) or (2): (1) the reference information includes information regarding one or more of a shape of the component, a brightness value of the component, and a characteristic value of the component; and (2) the mounting target is a board including multiple substrates, and the predetermined region is a region of the substrate.

4. A mounting system comprising:

multiple mounting devices according to claim 1.

5. A mounting device used in a mounting system including multiple mounting devices each performing a mounting process on a mounting target, the mounting device comprising:

a mounting section configured to pick up a component from a supply section holding the component and perform the mounting process for the component on the mounting target;

an inspection section configured to perform an inspection process on the component disposed on the mounting target by using reference information; and a control section configured to, when the reference information is updated to updated reference information after an error in the component subjected to a prior mounting process prior to the mounting device is detected, cause the inspection section to execute the inspection process using the updated reference information on the component subjected to the prior mounting process, wherein the control section has a skip mode in which, when there is an error in a predetermined region including the component subjected to the prior mounting process, an operation of the mounting section is restricted such that the mounting process is skipped without being performed on the predetermined region in which there is the error, and causes the inspection section to execute the inspection process using the updated reference information on the skipped predetermined region when the reference information is updated.

6. The mounting device according to claim 5, wherein the control section causes the mounting section to execute the mounting process on the skipped predetermined region when the component to be subjected to the mounting process on the skipped predetermined region is present in the supply section after the reference information is updated.

7. The mounting device according to claim 6, wherein the supply section is provided with a holding member holding the component, and the mounting system further includes a mobile work device including an accommodation section configured to accommodate the holding member to collect the holding member from the supply section and/or to move the holding member to the supply section, the control section outputs, to the mobile work device, information for moving the holding member holding the component to be mounted to the supply section when the component to be subjected to the mounting process on the skipped predetermined region can be picked up by the mounting section and is not present in the supply section.

8. An inspection/mounting method used in a mounting system including multiple mounting devices each performing a mounting process on a mounting target and including a mounting section configured to pick up a component from a supply section holding the component and perform the mounting process for the component on the mounting target, and an inspection section configured to perform an inspection process on the component disposed on the mounting target by using reference information, the inspection/mounting method comprising:

a step of, when the reference information is updated to updated reference information after an error in the component subjected to a prior mounting process prior to the mounting device is detected, causing the inspection section to execute the inspection process using the updated reference information on the component subjected to the prior mounting process a step of, when the error is detected in a predetermined number of the mounting targets at a specific disposition position, stopping at least one of the mounting section and the inspection section and notifying an operator to check the reference information, and a step of, when the reference information is updated, restarting processes of the at least one of the mounting section the inspection section.

* * * * *